(12) United States Patent
Lee et al.

(10) Patent No.: US 7,655,099 B2
(45) Date of Patent: Feb. 2, 2010

(54) HIGH-K DIELECTRIC FILM, METHOD OF FORMING THE SAME AND RELATED SEMICONDUCTOR DEVICE

(75) Inventors: Kil-Ho Lee, Wappingers Falls, NY (US); Chan Lim, Curpertino, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/117,274

(22) Filed: May 8, 2008

(65) Prior Publication Data

US 2008/0246100 A1   Oct. 9, 2008

Related U.S. Application Data

(60) Division of application No. 11/342,370, filed on Jan. 27, 2006, now Pat. No. 7,405,482, which is a continuation of application No. PCT/EP03/50352, filed on Jul. 30, 2003.

(51) Int. Cl.
*H01L 21/336* (2006.01)
(52) U.S. Cl. ............... 148/33.3; 257/411; 257/532; 257/E21.192
(58) Field of Classification Search ........... 438/216, 438/287, 240, 763, FOR. 220, FOR. 202, 438/FOR. 193; 257/E21.192, 422, 532; 148/33.3
See application file for complete search history.

(56) References Cited

U.S. PATENT DOCUMENTS

| | | | |
|---|---|---|---|
| 5,834,353 A | 11/1998 | Wu | |
| 5,876,788 A | 3/1999 | Bronner et al. | |
| 5,880,508 A | 3/1999 | Wu | |
| 6,013,553 A | 1/2000 | Wallace et al. | |
| 6,020,243 A | 2/2000 | Wallace et al. | |
| 6,291,866 B1 | 9/2001 | Wallace et al. | |
| 6,291,867 B1 | 9/2001 | Wallace et al. | |
| 6,586,349 B1* | 7/2003 | Jeon et al. | 438/785 |
| 6,682,973 B1* | 1/2004 | Paton et al. | 438/240 |
| 6,693,004 B1* | 2/2004 | Halliyal et al. | 438/240 |
| 2002/0100946 A1* | 8/2002 | Muller et al. | 257/410 |
| 2002/0102797 A1* | 8/2002 | Muller et al. | 438/287 |

(Continued)

FOREIGN PATENT DOCUMENTS

EP   1 271 632 A1   1/2003

(Continued)

OTHER PUBLICATIONS

International Preliminary Examination Report from corresponding International Application No. PCT/EP03/50352.

(Continued)

*Primary Examiner*—George Fourson
(74) *Attorney, Agent, or Firm*—Brinks Hofer Gilson & Lione

(57) ABSTRACT

A high-k dielectric film, a method of forming the high-k dielectric film, and a method of forming a related semiconductor device are provided. The high-k dielectric film includes a bottom layer of metal-silicon-oxynitride having a first nitrogen content and a first silicon content and a top layer of metal-silicon-oxynitride having a second nitrogen content and a second silicon content. The second nitrogen content is higher than the first nitrogen content and the second silicon content is higher than the first silicon content.

4 Claims, 3 Drawing Sheets

U.S. PATENT DOCUMENTS

| | | | |
|---|---|---|---|
| 2003/0111678 A1* | 6/2003 | Colombo et al. | 257/240 |
| 2004/0094809 A1* | 5/2004 | Frank et al. | 257/410 |
| 2004/0251489 A1* | 12/2004 | Jeon et al. | 257/315 |
| 2005/0153571 A1* | 7/2005 | Senzaki | 438/778 |
| 2005/0170604 A1* | 8/2005 | Orlowski et al. | 438/404 |
| 2005/0196970 A1* | 9/2005 | Misra et al. | 438/778 |
| 2005/0205920 A1* | 9/2005 | Jeon et al. | 257/310 |
| 2005/0205923 A1* | 9/2005 | Han et al. | 257/315 |
| 2005/0247970 A1* | 11/2005 | Jeon et al. | 257/314 |
| 2005/0260816 A1* | 11/2005 | Orlowski | 438/283 |
| 2006/0077743 A1* | 4/2006 | Jeon et al. | 365/222 |
| 2006/0220157 A1* | 10/2006 | Kalpat et al. | 257/411 |

FOREIGN PATENT DOCUMENTS

WO      WO 01/66832 A2      9/2001

OTHER PUBLICATIONS

International Search Report from corresponding International Application No. PCT/EP03/50352.

M.R. Visokay, J.J. Chambers, A.L.P. Rotondaro, A. Shanware and L. Colombo, *Application of HfSiON as a Gate Dielectric Material*, pp. 3183-3185, Applied physics Letters, vol. 80, No. 17, Apr. 29, 2002.

Takeshi Yamaguchi, Ryosuki Iijima, Tsunehiro Ino, Akira Nishiyama, Hideki Satake and Noburu Fukushima, *Additional Scattering Effects for Mobility Degradation in HF-Silicate Gat MISFETs*, (4pgs.) IEEE 2002.

H. Iwai, S. Ohmi, S. Kkama, C. Ohshima, A. Kikuchi, I. Kashiwagi, J. Taguchi, H. Yamamoto, J. Tonotani, Y. Kim, I. Ueda, A. Kuriyama and Y. Yoshihara, (4pags.), IEEE 2002.

Masato Koyama, Akio Kaneko, Tsunehiro Ino, Masahiro Koike, Yoshiki Kamata, Ryosuke Iijima, Yuichi Kamimuta, Akira Takashima, Masamichi Suzuki, Chie Hongo, Seiji Inumiya, Mariko Takayanagi and Akira Nishiyama, *Effects of Nitogen in HfSiON Gate Dielectric on Electrical and Thermal Charicteristics*, pp. 849-852, International Electron Devices Meeting, 2002, Dec. 8-11, 2002IEEE 2002.

Jong-Ho Lee, Yun-Seok Kim, Hyung-Seok Jung, Jung-Hyoung Lee, Nae-In Lee, Ho-Kyu kang, Youn-Keum Kim, Kyung-Hwan Cho, and Kwang-Pyuk Suh, *Poly-Si Gate CMOSFETs with $HfO_2$-$Al_2O_3$ Laminate Gate Dielectric for Low Power Applications*, 2pgs., 2002 Symposium on VLSI Technology Digest of Technical Papers, IEEE 2002.

S. Ohmi, S. Akama, A. Kikuchi, I. Kashiwagi, C. Ohshima, J. Taguchi, H. Yamamoto, C. Kobayashi, K. Sato, M. Takeda, K. Oshima, H. Ishiwara and H. Iwai, *Rare Earth Metal Oxide Gate Thin Films Prepared by E-beam Deposition*, pp. 1-5, IWGI 2001.

M.A. Quevedo-Lopez, M. El-Bounanani, M. J. Kim, B.E. Gnade and R.M. Wallace, *Effect of N Incorporation on Boron Penetration From P= Polycrytaline-Si through $HfSixOy$ Films*, pp. 4669-4671, Applied Physics Letters, vol. 82, No. 26, Jun. 30, 2003.

A.L.P. Rotondaro, M.R. Visokay, J.J. Chambers, A. Shanware, R. Khamankar, H. Bu, R.T., Laaksonen, L. Tsung, M. Douglas, R. Kuan, M.J. Bevan T. Grider, J. McPherson and L. Colombo, *Advanced CMOS Transistors with a Novel HfSiON Gate Dielectrici*, pp. 148-149, 2002 Symposium on VLSI Technology Digest of Technical Papers, IEEE 2002.

A. Shanware, J. McPherson, M.R. Visokay, J.J. Chambers, A.L.P. Rotondaro, H. Bu, M.J. Bevan, R. Khamankar, L. Colombo, *Reliability Evaluation of HfSiON Gate Dielectric Film with 12 $SiO_2$ Equivalent Thickness*, pp. 6.6.1-6.6.4, International Election Devices Meeting, Dec. 2-5, 2001, IDEM, Technical Digest.

* cited by examiner

HIGH-K DIELECTRIC FILM, METHOD OF FORMING THE SAME AND RELATED SEMICONDUCTOR DEVICE

PRIORITY CLAIM

This application is a divisional of U.S. patent application Ser. No. 11/342,370, filed Jan. 27, 2006 now U.S. Pat. No. 7,405,482 which is a continuation of international application PCT/EP2003/050352, filed on Jul. 30, 2003, all of which are incorporated in their entirety by reference.

TECHNICAL FIELD

The present invention relates to a high-k dielectric film, a method of forming the same and related semiconductor devices, and in particular to high-k dielectric films related to a gate dielectric for field effect semiconductor devices or a capacitor dielectric for trench capacitors in integrated circuits.

BACKGROUND

For forming semiconductor devices like CMOS devices (Complementary Metal Oxide Semiconductor), MOSFET devices (Metal Oxide Semiconductor Field Effect Transistor) or high memory devices such as DRAMs (Dynamic Random Access Memories), it is often useful to form a thin, high dielectric constant (high-k) film onto a substrate, such as a silicon wafer. A variety of techniques have been developed to form such thin films on a semiconductor wafer.

In the past, gate dielectric layers have been formed using silicon dioxide. The scaling down of the above described devices, however, has increased the demand for gate dielectrics with a higher dielectric constant than silicon dioxide. This is necessary to reach ultra thin oxide equivalent thicknesses (EOT, Equivalent Oxide Thickness) without compromising gate leakage current.

In detail, as semiconductor devices have scaled to smaller dimensions, effective gate dielectric thickness has gotten thinner. The continued scaling of conventional gate dielectrics, such as $SiO_2$ and $SiO_xN_y$, has almost reached the fundamental limits of very high gate leakage current, due to direct tunneling, which is not acceptable in a scaled device requirement of a low leakage current. In order to suppress the high leakage current, several high-k films of transition metal oxide and silicate, such as $HfO_2$, $ZrO_2$, Hf-aluminate, Zr-aluminate, Zr-silicate, Hf-silicate and a lanthanide oxide like $La_2O_3$, $Pr_2O_3$, and $Gd_2O_3$, have been studied in replacement of $SiO_2$ and $SiO_xN_y$.

However, these conventional materials have shown a number of disadvantages. According to S. OHMI, et al., "Rare earth metal oxide gate thin films prepared by E-beam deposition", International Workshop on Gate Insulator 2001, Tokyo, Japan, it is known that $ZrO_2$ or $HfO_2$ has shown micro crystal formation, resulting in high leakage current.

Furthermore, from J. H. LEE, et al., "Poly-Si gate CMOS-FETs with $HfO_2$—$Al_2O_3$ laminate gate dielectric for low power applications", Tech. Dig. VLSI, page 84, 2002, it is known that $HfO_2$—$Al_2O_3$ laminate or Hf-aluminate have serious mobility degradation due to fixed charges in the high-k dielectric film.

Moreover, TAKESHI, YAMAGUCHI, et al., "Additional scattering effects for mobility degradation in Hf-silicate gate MISFETs" Tech. Dig. IEDM 2002 reports that in case of Zr-silicate or Hf-silicate, phase separation of the film into $HfO_2$ and $SiO_2$ regions by the high temperature anneal induces also mobility degradation.

For lanthanide oxides, leakage current results have indicated that lanthanide oxides may be possible candidates of future dielectrics. However, according to H. IWAI, et al., "Advanced gate dielectric materials for Sub-100 nm CMOS", Tech. Dig. IEDM 2002, it is reported that these lanthanide oxides also form interfacial layers on Si substrates after subsequent thermal annealing, which may indicate thermal instability of these lanthanide oxides.

Moreover, impurity penetration such as boron penetration from e.g. a gate layer to a Si substrate is a further problem to be solved by these high-k dielectric films. Even though nitrogen incorporation on $HfSi_xO_y$ has been known to suppress impurity penetration (e.g. boron penetration) and improve thermal stability, it was also reported that a very high Si content of Si/[Si+Hf] ratio of over 80% in $HfSi_xO_yN_z$ prevents flat band voltage shift, resulting in seriously reducing dielectric constant of the film even with a high nitrogen content of 30 atomic percent (see M. KOYAMA, et al. "Effects of nitrogen in HfSiON gate dielectric on the electrical and thermal characteristics", Tech. Dig. IEDM 2002, 34-1). This high Si content low-k dielectric film of $HfSi_xO_yN_z$ is almost the same as conventional $SiO_xN_y$ in terms of dielectric constant. Other technical problems of the formation of respective films on Si substrate are that a high nitrogen concentration at the interface between the dielectric layer and the Si substrate can be induced by subsequent high thermal annealing to degrade mobility.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

Skilled artisans appreciate that elements in the figures are illustrated for simplicity and clarity and have not necessarily been drawn to scale.

DETAILED DESCRIPTION

Figure 1A:
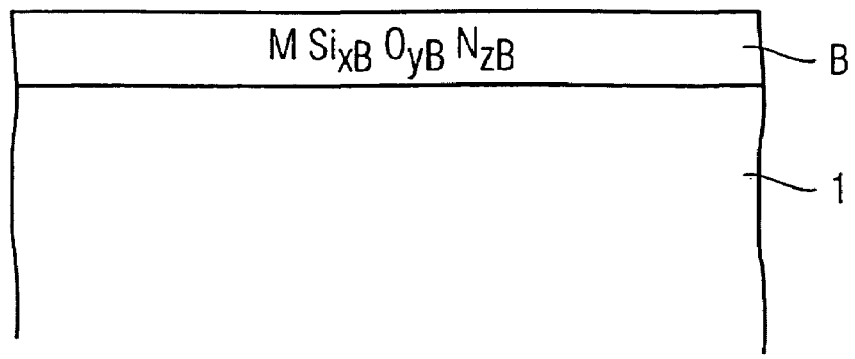
FIGS. 1A and 1B are partial cross-sectional views showing production of a high-k dielectric film according to a first embodiment.
Figure 1B:
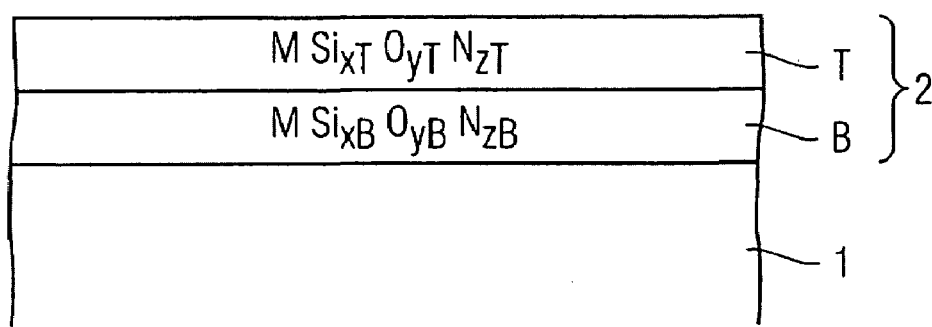

FIGS. 1A and 1B show partial cross-sections illustrating production of a high-k dielectric film according to a first embodiment. FIG. 1A illustrates a semiconductor substrate, such a monocrystalline Si substrate 1, is used as a base. On the surface of the substrate 1, a bottom layer B of metal-silicon-oxynitride ($MSi_{xB}O_{yB}N_{zB}$) is formed by layer deposition methods.

As shown in FIG. 1B, a top layer T is formed by the same metal-silicon-oxynitride on the surface of the bottom layer B. However, the top layer T has different silicon content and nitrogen content than the bottom layer B. In more detail, the deposited top layer T contains $MSi_{xT}O_{yT}N_{zT}$ having a second nitrogen content zT and a second silicon content xT. The nitrogen content zB and zT of the bottom and top layer B and T as well as the silicon content xB and xT are selected such that the nitrogen content zT of the top layer T is higher than the nitrogen content zB of the bottom layer and the silicon content xT of the top layer T is higher than the silicon content xB of the bottom layer.

The indices x, y and z or xB, yB and zB or xT, yT and zT in the $MSi_xO_yN_z$ layers are real positive values indicating molecular atomic percentage. Nitrogen atomic percentage in respective layer is calculated by $(z/(1+x+y+z)) \times 100$. Usually, Si and M (metal) concentrations are presented by $(x/(1+x)) \times 100$ and $(1/(1+x)) \times 100$, respectively.

The bilayer stack shown in FIG. 1B constitutes a high-k dielectric film 2. In more detail, the high-nitrogen-content top layer T of the bilayer stack prevents diffusion of e.g. boron from a boron-doped poly-Si electrode (not shown) into the field effect device channel, whereas the low-nitrogen-content bottom layer B is decreases mobility degradation within this channel and/or the substrate 1. Moreover, since a decrease of Si content in metal-silicon-oxynitrides is related to an increase of the metal content and, in turn, an increase of the dielectric constant, the bilayer stack provides a higher dielectric constant than a similar high-Si-content metal-silicon-oxynitride. Thus, it is possible to further scale down an effective oxide thickness (EOT), while leakage caused by direct tunneling is reduced.

Si and N concentrations in the top layer T are higher than those in the bottom layer B, e.g. xT>xB, zT>zB. A ratio of N and Si in the top layer T with respect to the bottom layer B depends on what metal-silicon-oxides are used. If Hf is used as the metal M in the metal-silicon-oxynitride layer ($HfSi_xO_yN_z$), the Si/(Hf+Si) ratio of $HfSi_xO_yN_z$ is in the range of about 70% to 95% with an N concentration of as high as about 30 atomic percent. Thus, for a fixed Si and N concentration in the top layer T using Hf as metal, the N and Si content of the bottom layer B are lower than those of the top layer T, with the N atomic percentage in the range from about 15% to 25% and a Si/(Hf+Si) ratio in the range from about 20% to 60%.

Concerning the thickness of the different layers, the top layer T has a smaller thickness than the thickness of the sum of the other layers within the high-k dielectric film 2 or the same. That is, the top layer T in the bilayer structure of the first embodiment is thinner than or equal to the bottom layer B.

After formation of the high-k dielectric film 2, an anneal process may be used to increase the density of the layer stack and to reduce defects to improve the quality of the high-k dielectric film 2 such as to improve the leakage current characteristics. The anneal process may occur at a temperature of over 600° C. in $N_2$ or other gas.

Figure 2:
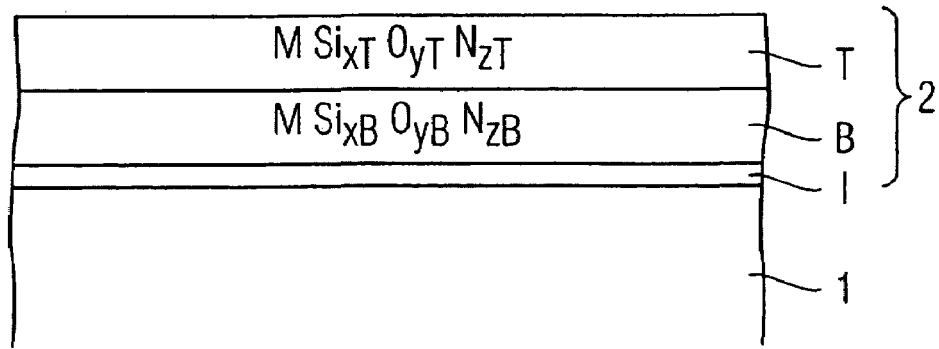
FIG. 2 is a partial cross-sectional view of the high-k dielectric film according to a second embodiment.

FIG. 2 shows a partial cross-sectional view of a high-k dielectric film according to a second embodiment. The same reference numbers refer to the same or corresponding layers and a repeated description of these layers is omitted. According to the second embodiment, a substrate interface layer I is formed on the surface of the substrate 1. The respective top and bottom layers T and B of the high-k dielectric film 2 are formed on the surface of the substrate interface layer I. If a Si substrate 1 is used, the substrate interface layer may contain a silicon oxide, which further increases the mobility within the substrate and reduces defects at the surface of the substrate 1.

Besides the bilayer $MSi_xO_yN_z$ stack of the first and second embodiment having a bottom layer and a top layer of metal-silicon-oxynitride, at least another metal layer of metal-silicon-oxynitride may be formed between the bottom layer B and the top layer T. This additional layer(s) may have nitrogen and silicon contents between the nitrogen and silicon contents of the bottom layer B and top layer T. In particular, the nitrogen and silicon content of this middle layer is higher than the nitrogen and silicon contents of a metal-silicon-oxynitride layer formed in a layer formed previously. The thickness of the top layer T is again equal to or less than the sum of thicknesses of the remaining layers in the high-k dielectric film or multilayer stack, i.e. the bottom layer and the middle layer(s).

Physical vapor deposition (PVD) may be used to deposit various $MSi_xO_yN_z$ layers. In one embodiment, co-sputtering of metal, such as Hf, Zr, La, Pr, Gd and other lanthanide metals, and silicon in an $Ar/N_2/O_2$ ambient may be used to form metal-silicon-oxynitride films. Nitrogen concentration and silicon concentration in these metal-silicon-oxynitrides can be controlled by $N_2$ flow and silicon sputtering rate. High nitrogen content metal-silicon-oxynitride with a small amount of silicon can be obtained using high-nitrogen flow during the co-sputtering of Si. A poly-Si electrode (not shown) may additionally be formed on the top of the high-k dielectric film in any embodiment.

In one embodiment, a high nitrogen content and high silicon content metal-silicon-oxynitride at the top part of the high-k dielectric film 2 and a lower nitrogen content and a lower silicon content at the bottom part of the high-k dielectric film 2 can be formed to keep the interface of the high-k dielectric film 2 and the poly-Si electrode, if formed, thermally stable. Poly-Si electrode deposition usually is performed using $SiH_4$ or $Si_2H_6$. This may induce reduction of metal-O and metal-N bonds by hydrogen coming from $SiH_4$ or $Si_2H_6$. The reduction may generate defects and, in turn, result in high leakage current. High nitrogen concentrations and high silicon concentrations in metal-silicon-oxynitride suppress reaction between hydrogen and the high-k dielectric film during a poly-Si deposition due to a number of Si—N and Si—O bonds in the place of metal-O and metal-N bonds. Similar advantages result when using a metallic material instead of poly-Si as an electrode formed on the surface of the high-k dielectric film 2.

Thus, $ZrSi_xO_yN_z$, $HfSi_xO_yN_z$, $LaSi_xO_yN_z$, $PrSi_xO_yN_z$, $GdSi_xO_yN_z$, $DySi_xO_yN_z$, and other nitrogen incorporated lanthanide-silicates can be formed as high-k dielectric films.

FIGS. 3A to 3D show partial cross-sectional views illustrating steps for producing a high-k dielectric film according to a third embodiment. Again, the same reference numbers refer to same or corresponding layers as in FIGS. 1 and 2, and, therefore, a repeated description of these layers is omitted in the following. According to the third embodiment a triple layer stack is formed by an alternative method to provide the high-k dielectric film 2.

Figure 3A:
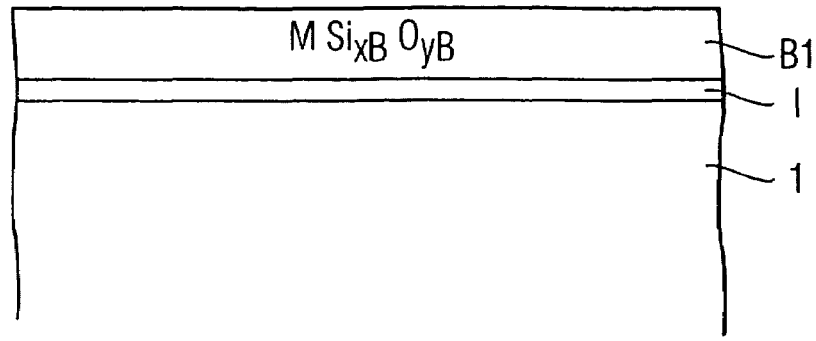
FIGS. 3A to 3D are partial cross-sectional views showing production of a high-k dielectric film according to a third embodiment.

According to FIG. 3A, a substrate interface layer I is formed directly on the surface of the substrate 1, for example by a thermal process. Thus, a $SiO_2$-substrate interface layer I is formed on the Si substrate 1. A pre-bottom layer B1 of metal-silicon-oxide having a low first silicon content xB is then formed by a method such as deposition on the substrate interface layer I.

Figure 3B:
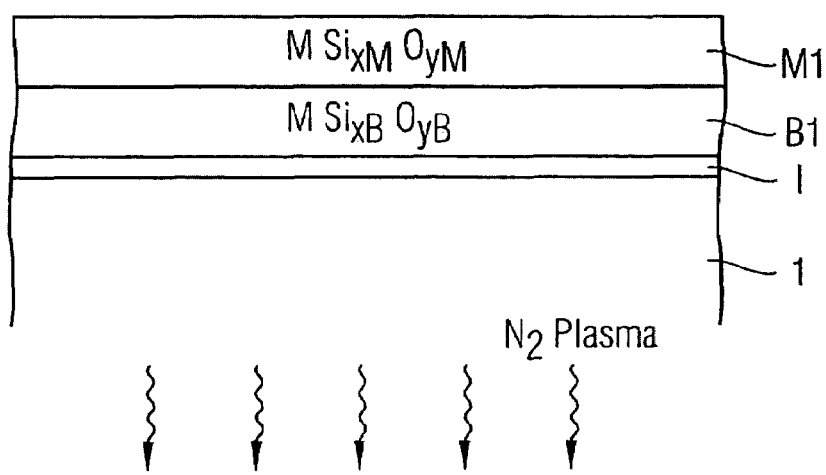

According to FIG. 3B, a pre-middle layer M1 of metal-silicon-oxide having a silicon content xM is deposited on the pre-bottom layer B1 having the silicon content xB. The silicon content xM of the layer or the pre-middle layer M1 is higher than that of the bottom layer B1 or (if a plurality of middle layers are to be used) is higher than that of the preceding layer.

Figure 3C:
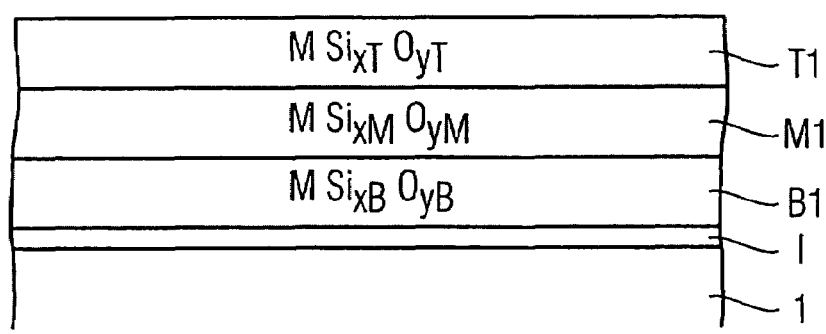

According to FIG. 3C, a pre-top layer T1 of metal-silicon-oxide having a silicon content xT is formed on the pre-middle layer M1. The second silicon content xT of the pre-top layer T1 is higher than the that of the pre-middle layer M1 which is higher than that of the pre-bottom layer B1.

Furthermore, an $N_2$ plasma treatment is performed on the metal-silicon-oxide layers forming SiN bond rather than metal-N bond. Thus, as the Si content in the different layers is different, the nitrogen content after the $N_2$ plasma treatment is different. In one example, it is known that $HfSi_xO_y$ can be formed by various deposition methods, such as MOCVD (Metal Organic Chemical Vapor Deposition), PVD (Physical Vapor Deposition), or ALD (Atomic Layer Deposition). Using MOCVD $HfSi_xO_y$, two precursors, $Hf[N(C_2H_5)_2]_4$ for Hf and $Si[N(CH_3)_2]_4$ for Si, flow into a reactor together with $O_2$ to deposit $HfSi_xO_y$. The $SiO_2$ mole fraction in $HfSi_xO_y$ can be controlled by controlling the process parameters, such as temperature, pressure and both precursor flow rates, during the silicate deposition.

Increasing the temperature from 325° C. to 650° C. increases the $SiO_2$ mole fraction in $HfSi_xO_y$ from about 20% to 65%. Changing the process pressure from about 400 Pa (3 Torr) to 1065 Pa (8 Torr) results in increasing the $SiO_2$ mole fraction from about 30% to 45%.

In the third embodiment, MOCVD $HfSi_xO_y$ is used. A sequence for depositing low $SiO_2$ content $HfSi_{xB}O_{yB}$ and high $SiO_2$ content $HfSi_{xT}O_{yT}$ are deposited at the bottom part and at the top part of the high-k dielectric film 2 and then followed by $N_2$ plasma treatment. After $N_2$ plasma nitration, the top layer T of the film 2 has a high nitrogen content and the bottom layer B has a low nitrogen content.

Alternatively, a Zr silicate can be used instead of MOCVD Hf silicate. In this case, the precursors used to form the Zr silicate using MOCVD include $Zr[N(C_2H_5)_2]_4$ and $Si[N(CH_3)_2]_4$. In other embodiments, MOCVD lanthanide silicates can be formed using similar lanthanide MOCVD processes.

Figure 3D:
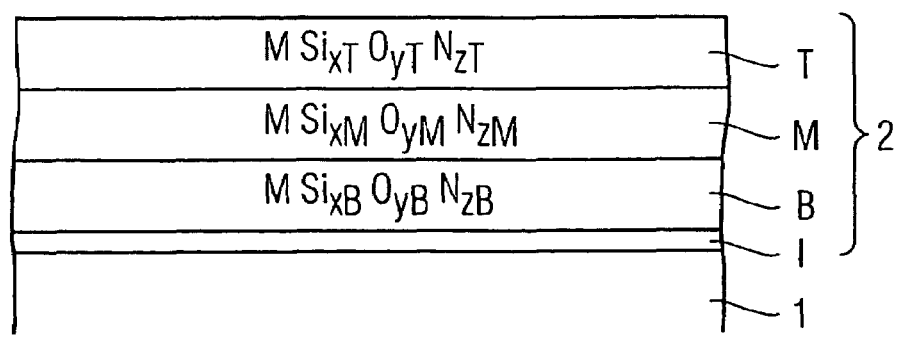

Thus, according to FIG. 3D, after performing a $N_2$ plasma treatment, the pre-bottom layer B1, the pre-middle layer M1 and the pre-top layer T1 are converted to a respective metal-silicon-oxynitride bottom layer B, middle layer M and top layer T. An annealing process may again be performed after the $N_2$ plasma treatment to repair the plasma damage to the high-k dielectric film 2, to increase the density of the high-k dielectric film, and/or to reduce defects as well as impurities in the high-k film stack.

Figure 4:
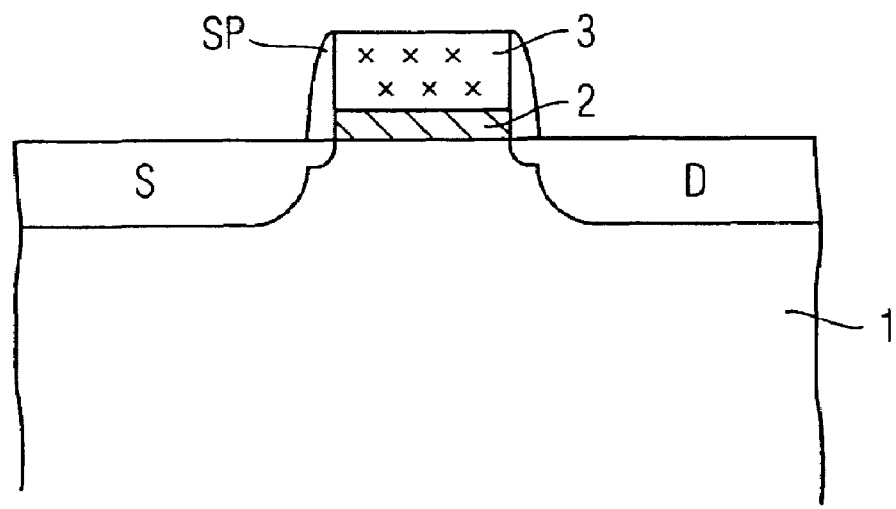
FIG. 4 is a partial cross-sectional view of a field effect semiconductor device using the high-k dielectric film.

FIG. 4 shows a partial cross-sectional view of a semiconductor device comprising a field effect transistor using the high-k dielectric film as a gate dielectric. In FIG. 4, a source region S, a drain region D and a channel region between the source and drain region are provided in a semiconductor substrate 1. The high-k dielectric film 2 is used as gate dielectric and formed on the channel region while a gate layer is formed on the gate dielectric 2. A spacer SP may be provided at the side walls of the gate stack. The spacer SP may aid in the formation of the source and drain regions S and D. The gate layer 3 may comprise a poly-Si or a metal gate. Use of a metal gate may improve the electrical characteristics of the semiconductor device.

Figure 5:
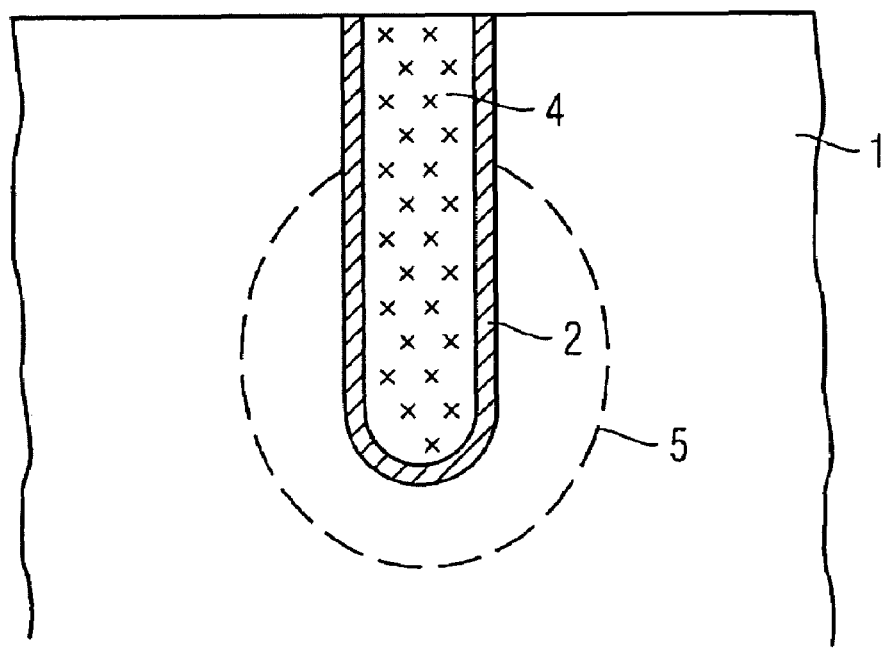
FIG. 5 is a partial cross-sectional view of a trench capacitor using the high-k dielectric film.

FIG. 5 shows a partial cross-sectional view of a semiconductor device in which the high-k dielectric film is used as a capacitor dielectric. Trench capacitors may be used in different semiconductor devices such as, e.g. DRAM (Dynamic Random Access Memory) devices. As shown in FIG. 5, a deep trench or hole is provided within the silicon substrate 1. The high-k dielectric film 2 is provided on the surface of the trench or hole after forming a second electrode 5 in the substrate 1 in the vicinity of the lower part of the trench. A filling material 4 is used as a first electrode of the resulting capacitor. The filling material 4 is usually highly doped poly-Si or a deposited metal. Thus, the high-k dielectric film improves the electric characteristics of semiconductor devices thereby enabling increased integration densities.

It will be appreciated to those skilled in the art having the benefit of this disclosure that a high-k dielectric film is provided. In addition, a method is provided for forming the high-k dielectric film as well as related semiconductor devices having an improved leakage current by reduced tunneling currents as well as improved diffusion barrier characteristics. Further modifications and alternative embodiments of various aspects of the invention will be apparent to those skilled in the art in view of this description.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A semiconductor device comprising a substrate, electrically conductive regions at least one of in or on the substrate, and multiple metal-silicon-oxynitride layers of silicon and nitrogen contents that increase with distance from the substrate.

2. The semiconductor device of claim 1, wherein the substrate is a semiconductor substrate, and the semiconductor device comprises a field effect transistor that includes a source region, a drain region, and a channel region provided in the semiconductor substrate, and a gate layer formed on the multiple metal-silicon oxynitride layers, the electrically conductive regions including the source and drain regions.

3. The semiconductor device of claim 1, wherein the substrate is a semiconductor substrate, and the semiconductor device comprises a trench capacitor with a first electrode, the multiple metal-silicon oxynitride layers, and a second electrode formed in the semiconductor substrate, the electrically conductive regions including the first and second electrodes.

4. The semiconductor device of claim 1, wherein the multiple metal-silicon oxynitride layers further comprises an interface layer formed between a bottommost metal-silicon-oxynitride layer and the substrate, the interface layer having a different composition than the bottommost layer.

* * * * *